(12) United States Patent
Fu et al.

(10) Patent No.: US 7,682,979 B2
(45) Date of Patent: Mar. 23, 2010

(54) PHASE CHANGE ALLOY ETCH

(75) Inventors: Qian Fu, Fremont, CA (US); Shenjian Liu, Fremont, CA (US); Linda Fung-Ming Lee, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 888 days.

(21) Appl. No.: 11/479,303

(22) Filed: Jun. 29, 2006

(65) Prior Publication Data

US 2009/0130855 A1    May 21, 2009

(51) Int. Cl.
  *H01L 21/3065*    (2006.01)
(52) U.S. Cl. ........... 438/710; 156/345.26; 257/E21.218
(58) Field of Classification Search ........................ None
  See application file for complete search history.

(56) References Cited

U.S. PATENT DOCUMENTS

| | | | |
|---|---|---|---|
| 6,087,689 A | 7/2000 | Reinberg | |
| 6,673,262 B1 * | 1/2004 | Mori et al. | 252/79.3 |
| 2003/0000924 A1 | 1/2003 | Strang | |
| 2005/0032374 A1 * | 2/2005 | Spandre | 438/689 |
| 2007/0158632 A1 * | 7/2007 | Ho | 257/4 |
| 2008/0266940 A1 * | 10/2008 | Lai et al. | 365/163 |

FOREIGN PATENT DOCUMENTS

WO    WO 2005/011011 A1    2/2005

OTHER PUBLICATIONS

International Search Report dated Nov. 13, 2007 from corresponding International Application No. PCT/US2007/070795.
Written Opinion dated Nov. 13, 2007 from corresponding International Application No. PCT/US2007/070795.

* cited by examiner

*Primary Examiner*—Allan Olsen
(74) *Attorney, Agent, or Firm*—Beyer Law Group LLP

(57) ABSTRACT

A method of forming devices is provided. A phase change layer is provided. The phase change layer is etched by providing an etch gas comprising a bromine containing compound and forming a plasma from the etch gas. The phase change layer is of a material that may be heated by a current and then when cooled, either forms an amorphous material or a crystalline material, depending on how fast the material is cooled. In addition, the amorphous material has a resistance at least several times greater than the crystalline material.

13 Claims, 5 Drawing Sheets

PHASE CHANGE ALLOY ETCH

BACKGROUND OF THE INVENTION

The present invention relates to the formation of semiconductor devices. More particularly, the invention relates etching to form phase change memory devices.

In the formation of phase change memory, an alloy, such as an alloy of germanium (Ge), antimony (Sb), and tellurium (Te) (hereinafter GST), is used to form phase change memory elements.

In an example of a phase change memory element, each element is made of GST. The elements may be heated and then cooled by passing a current through the element. A fast cool down may be used to provide an amorphous structure with an amorphous resistance ($r_a$). A slower cool down may be used to provide a more crystalline structure with a crystalline resistance ($r_c$), which is different from the first resistance.

SUMMARY OF THE INVENTION

To achieve the foregoing and in accordance with the purpose of the present invention a method of forming devices is provided. A phase change layer is provided. The phase change layer is etched by providing an etch gas comprising a bromine containing compound and forming a plasma from the etch gas.

In another manifestation of the invention an apparatus for forming features in a phase change layer is provided. A plasma processing chamber comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source is in fluid connection with the gas inlet and comprises a bromine containing compound gas source, a noble gas source, and an at least one of a fluorine containing compound and chlorine containing compound gas source. A controller is controllably connected to the gas source and the at least one electrode and comprises at least one processor and computer readable media. The computer readable media comprises computer readable code for providing an etch gas comprising a bromine containing compound and computer readable code for forming a plasma from the etch gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
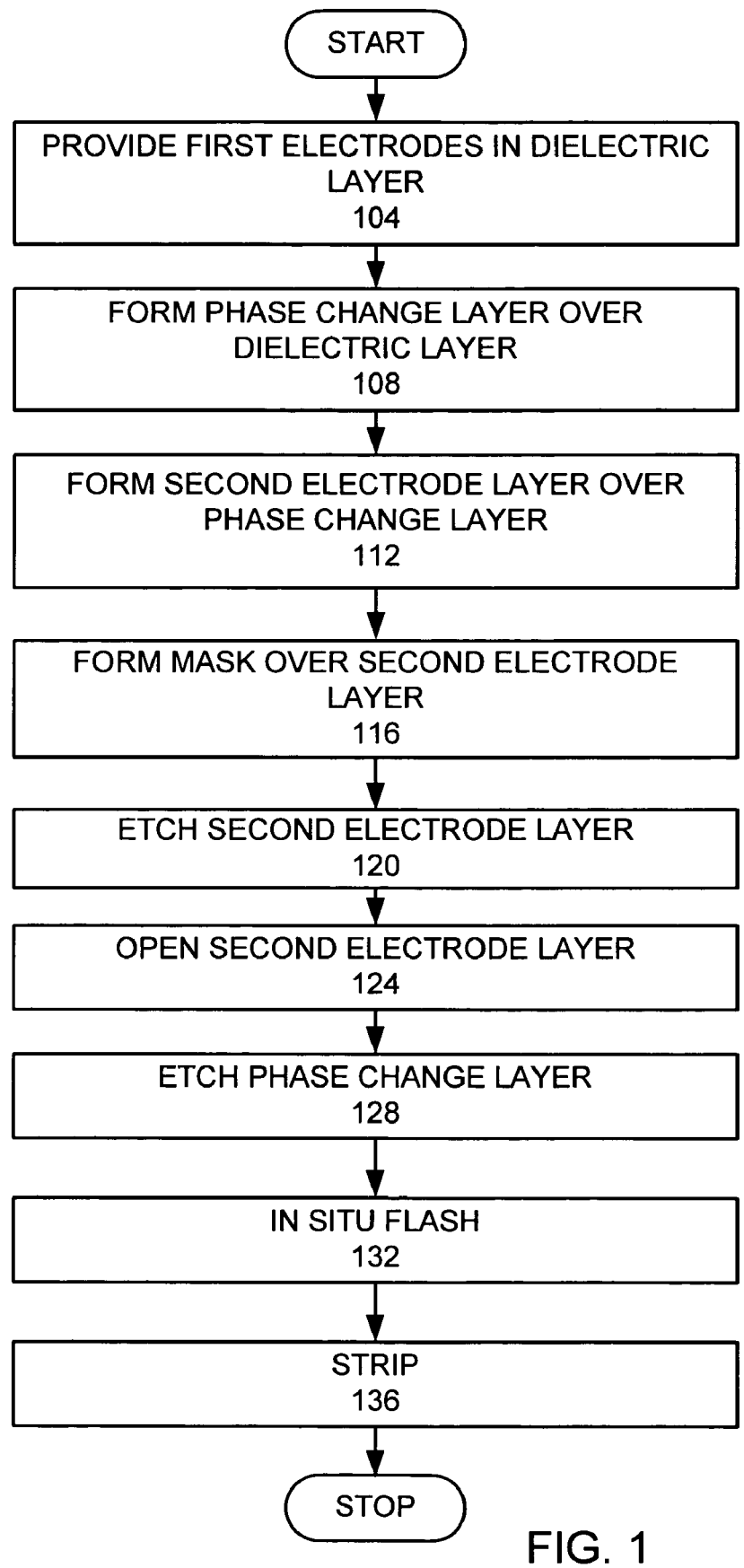
FIG. 1 is a high level flow chart of a process that may be used in an embodiment of the invention.
Figure 2A:
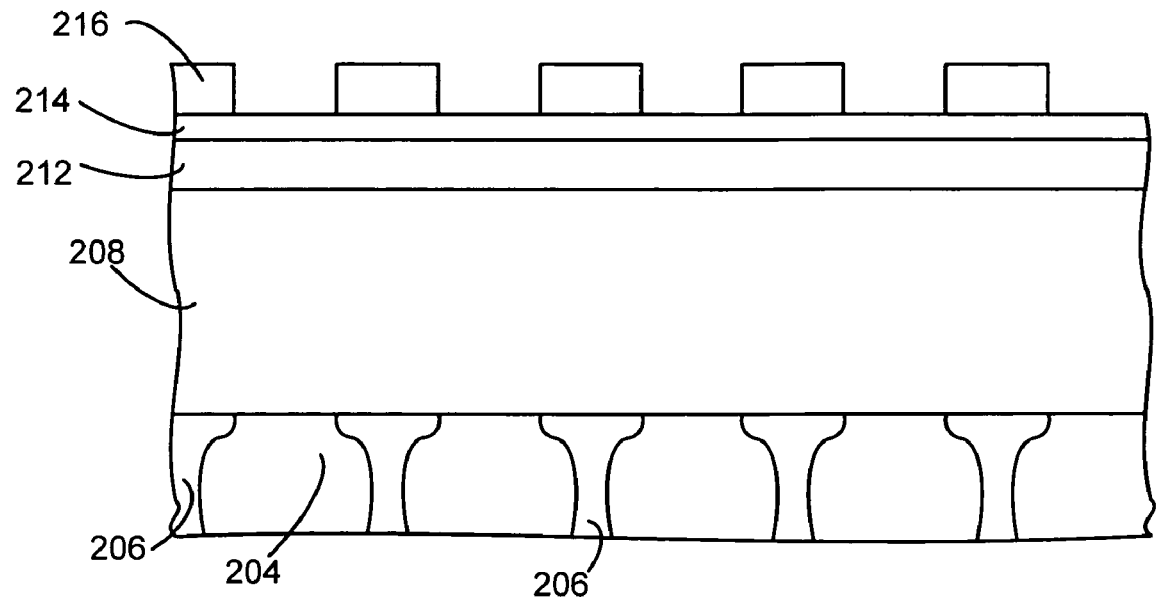
FIGS. 2A-D are schematic cross-sectional views of a stack processed according to an embodiment of the invention.

To facilitate understanding, FIG. 1 is a high level flow chart of a process that may be used in an embodiment of the invention. First electrodes are provided in a dielectric layer (step 104). FIG. 2A is a schematic cross-sectional view of a dielectric layer 204 with a plurality of first electrodes 206. In a preferred embodiment, the dielectric layer is silicon oxide or silicon nitride based dielectric.

A phase change layer 208 is formed over the dielectric layer 204 and the first electrodes 206 (step 108). A phase change layer 208 is of a material that may be heated by a current and then when cooled, either forms an amorphous material or a crystalline material, depending on how fast the material is cooled. In addition, the amorphous material has a resistance at least several times greater than the crystalline material. Preferably, the phase change layer is at least one of an alloy of germanium, antimony, and tellurium (GST) and an alloy of antimony and tellurium.

A second electrode layer 212 is formed over the phase change layer 208 (step 112). In a preferred embodiment, the second electrode layer 212 is titanium nitride (TiN) or tungsten nitride (WN).

Figure 2B:
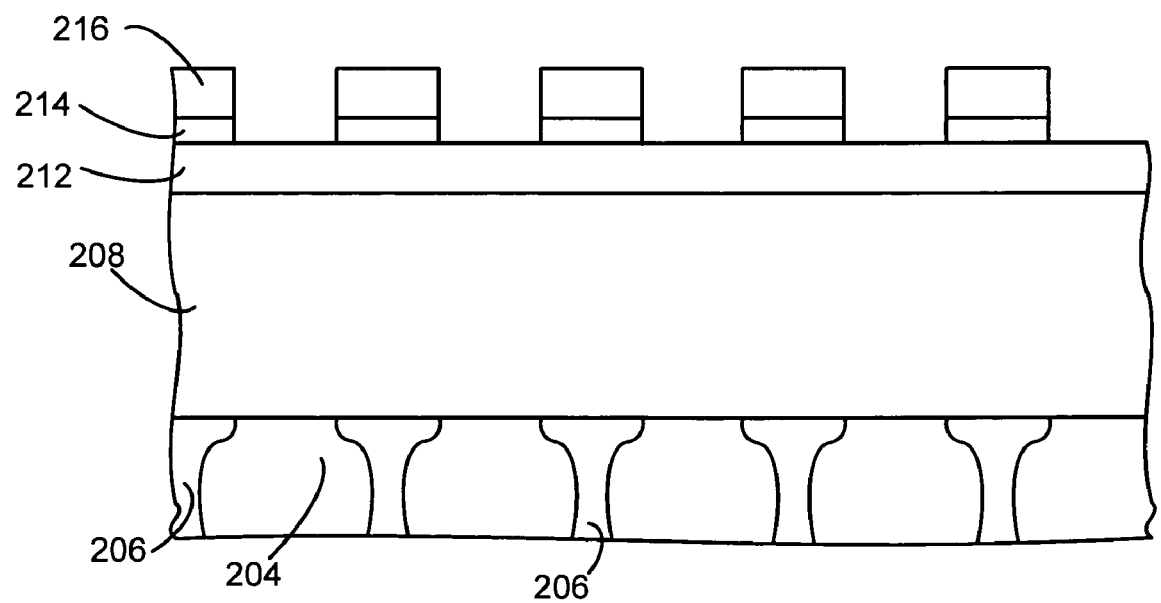

A mask is formed over the second electrode layer (step 116). In a preferred embodiment, the mask is formed by first forming a hardmask layer 214 over the second electrode layer 212. A photoresist mask 216 is formed over the hardmask layer 214. The hardmask layer 214 is etched through the photoresist mask 216 to form a mask over the second electrode layer 212, as shown in FIG. 2B.

Figure 3:
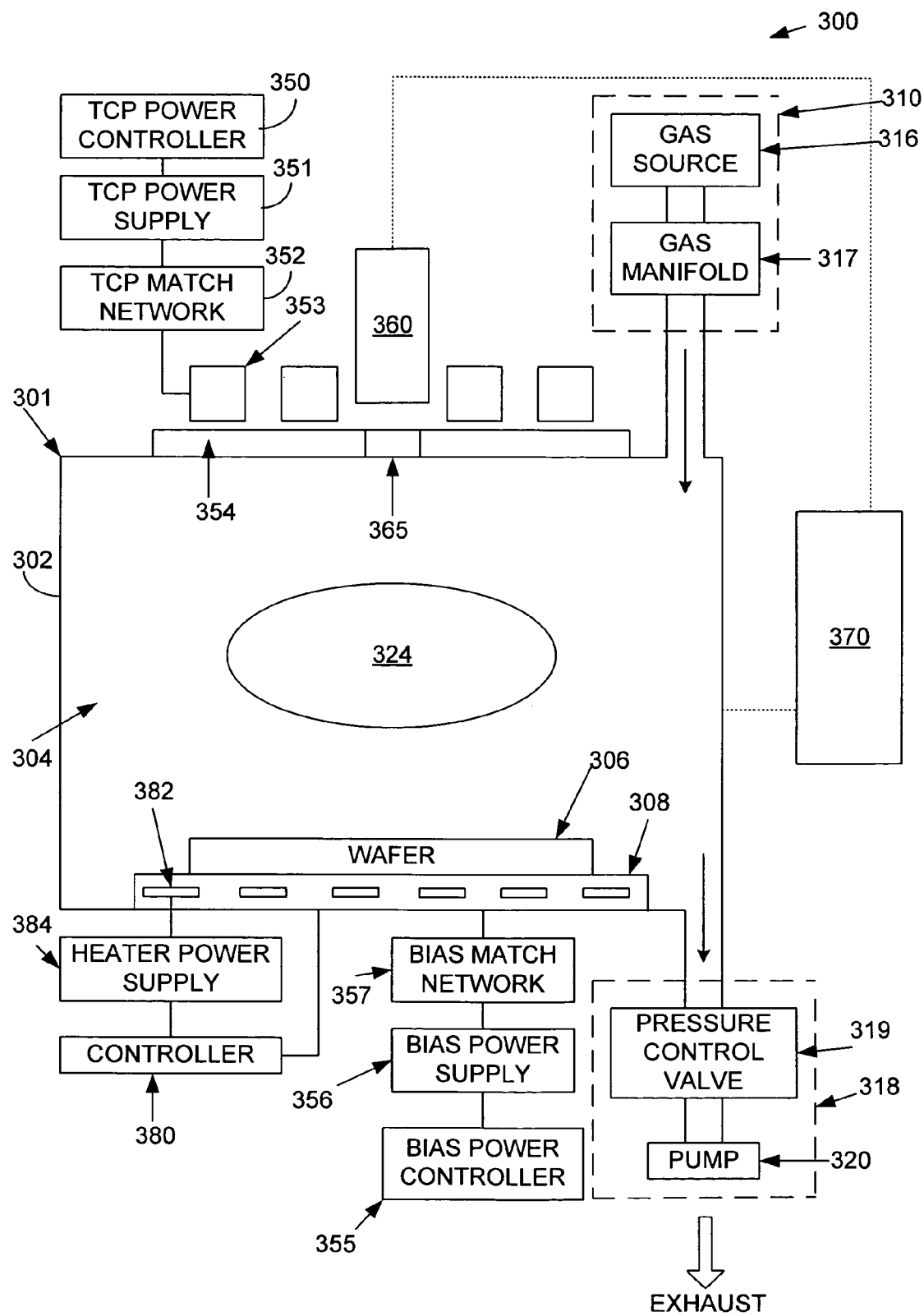
FIG. 3 is a schematic view of a plasma processing chamber that may be used in practicing the invention.

To etch the hardmask, the dielectric layer 214 and the related stack may be placed in a plasma processing chamber. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304 while allowing energy to pass from TCP coil 353 to plasma chamber 304. An optically transparent window 365 is provided by a circular piece of sapphire having a diameter of approximately 2.5 cm (1 inch) located in an aperture in the RF transparent window 354.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a substrate 306, such as a semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of heaters 382 provided within the chuck electrode 308 by controlling a heater power supply 384. The plasma processing system 300 also includes electronic control circuitry 370. The plasma processing system 300 may also have an end point detector 360.

Figure 4A:
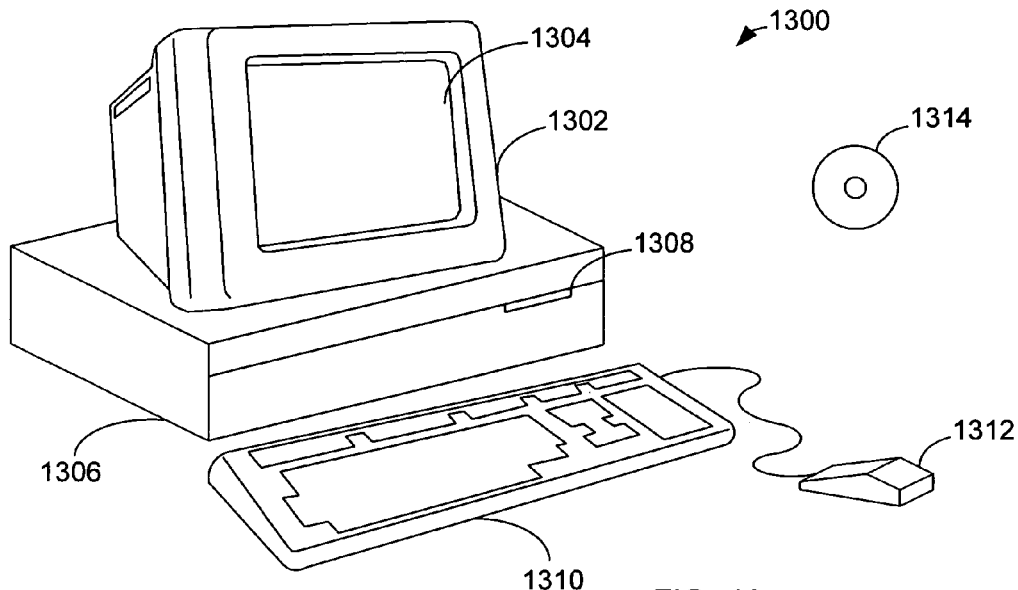
FIGS. 4A-B illustrate a computer system, which is suitable for implementing a controller used in embodiments of the present invention.
Figure 4B:
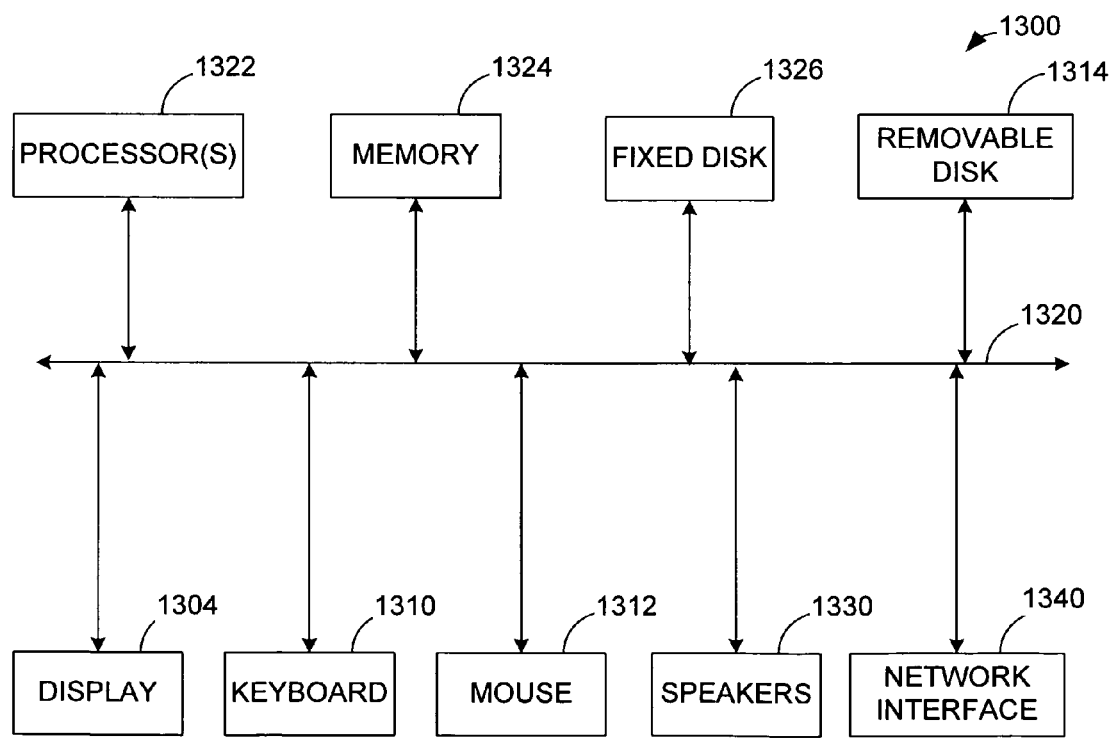

FIGS. 4A and 4B illustrate a computer system 1300, which is suitable for implementing controller for control circuitry 370 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2C:
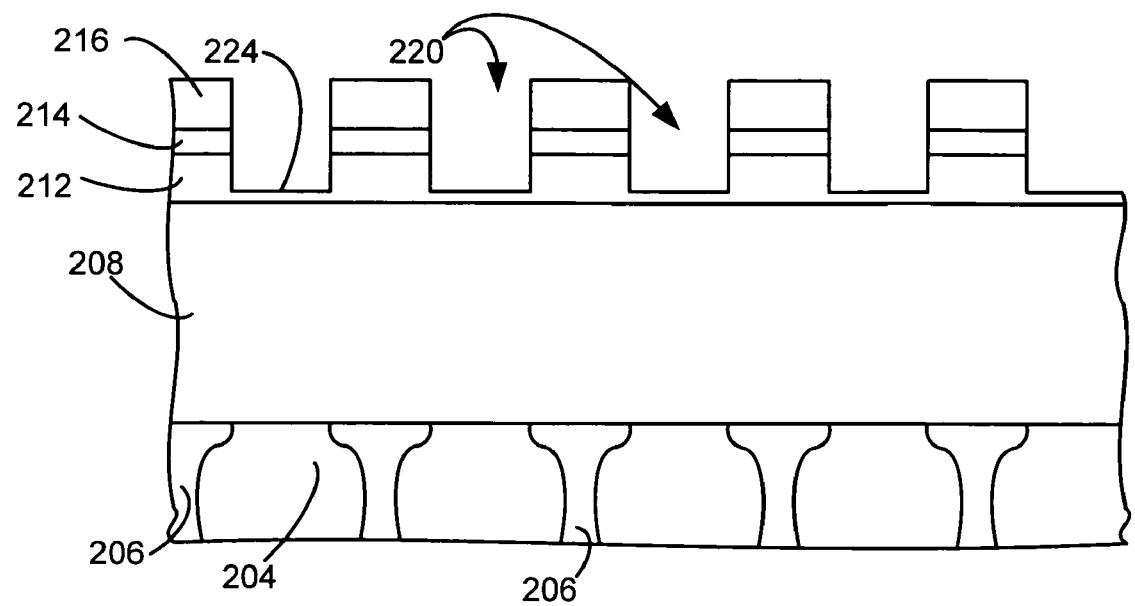

The second electrode layer is etched (step 120), as shown in FIG. 2C. In the preferred embodiment, at least some of the features 220 etched into the second electrode layer 212 are not etched completely through the second electrode layer 212. Instead, for at least some features, a thin remaining layer 224 of the second electrode layer 212 remains. More preferably, the second electrode layer 212 is not completely etched anywhere. The etch chemistry for the second electrode layer 212 in this embodiment may damage the phase change layer 208. Some etch processes for the second electrode layer may cause severe profile damage of the phase change layer if the second electrode layer is etched through to the phase change layer. Therefore, complete etch through of the second electrode layer 212 during the second electrode layer 212 etch is not desirable in these embodiments.

A conventional etch of the second electrode layer may be used. In the preferred embodiment, the etch of the second electrode uses a plasma chemistry of $Cl_2$ and $CF_4$ with some inert gas.

The second electrode layer was opened (step 124). In the preferred embodiment, an etch chemistry is used that does not damage the phase change layer. In a more preferred embodiment, an etch chemistry is used that both opens the second electrode layer and is useful for etching the etch phase change layer. Preferably, the etch chemistry uses a bromine (Br) containing etchant gas. Preferably, the etch chemistry provides a wafer temperature of less than 40° C. More preferably, the etch chemistry provides a temperature of less than 30° C. More preferably, the etch chemistry provides a temperature of not more than 20° C. Preferably, the etch chemistry further comprises at least one of a chlorine (Cl) and a fluorine (F) containing compound. Preferably, the etch chemistry further comprises a noble gas. More preferably, the noble gas is at least one of argon (Ar), neon (Ne), xenon (Xe), and helium (He). Preferably, the bromine containing etchant gas comprises HBr.

A typical recipe provided a pressure of 2-10 mTorr. 300-1000 watts were provided through the TCP coil. A 200-1000 volt bias was applied. An etch gas of 15-50 sccm HBr, 0-15 sccm $Cl_2$, and 50-500 sccm Ar was provided. A wafer temperature of 0-30° C. was provided.

Figure 2D:
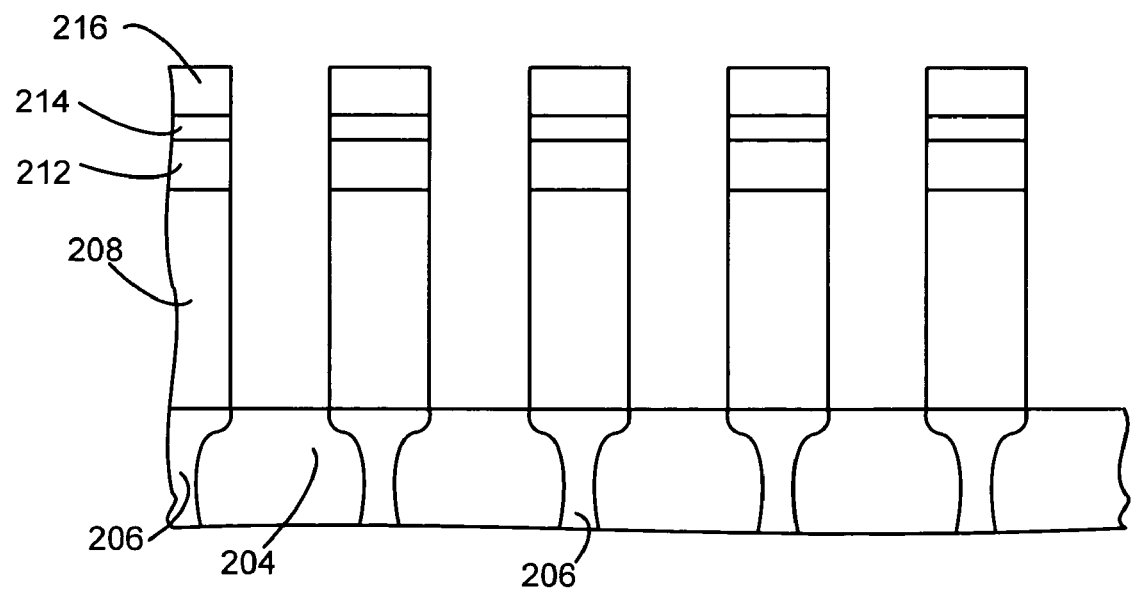

The phase change layer was etched (step 128), as shown in FIG. 2D. Preferably, the same recipe used for the opening of the second electrode layer is used for etching the phase change layer. In another embodiment, a different recipe is used to open the second electrode layer, such as a conventional open step, and the above-described preferred bromine containing recipes for opening the second electrode layer are instead only used to etch the phase change layer.

An in situ flash process was used to remove a sidewall passivation layer (step 132). An example of such a flash step provided a pressure of 2-20 mTorr. 300-1000 watts were applied through the TCP coil. A flash gas comprising 20-500 sccm $CF_4$ was provided. A wafer temperature was provided at 0-30° C. A $CF_4$ gas may be used as a flash gas, which is transformed to a plasma. It is believed that the sidewall passivation is formed from the tellurium containing compound, which protects the sidewall profile by preventing sidewall attack. A plasma is used for the flash step, since GST limits material that may be used for a wet clean step.

A typical strip process is used to remove any remaining photoresist (step 136). An $O_2$ gas may be used as a strip or ashing gas. Other additional steps may be provided, such as a step for removing the hardmask layer.

For the opening of the second electrode layer and the etching of the phase change layer the opening or etch gas preferably has a higher flow of noble gas than the flow of HBr and a lower flow of $Cl_2$ than the flow of HBr.

Without being bound by theory, it was found that an etch using a Br containing etchant at a low temperature, for example below 40° C., provides an etch that is able to etch the phase change layer, which is preferably GST, providing vertical sidewall, defined as having sidewall profiles making an angle of between 87° to 92° with the bottom of the features from the bottom to the top of the sidewalls. More preferably, the sidewalls are 90°. It was also found that such an etch provides minimal corroding of the GST. Such a recipe has been found to provide an etch selectivity of greater than 5:1 for etching GST with respect to a silicon oxide based dielectric.

The above process is for providing spaces on the order of 45 nm. Corrosion of the GST and sidewalls that depart from a vertical sidewall by more than 3 degrees, that may be caused by an etch recipe, significantly hurts the performance of the resulting devices.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method of forming devices, comprising:
   providing a phase change layer selected from the group consisting of a germanium/antimony/tellurium alloy and an antimony/tellurium alloy;
   providing an electrode layer over the phase change layer;
   opening the electrode layer and etching the phase change layer with an etching process comprising the steps of:
   providing an etch gas comprising HBr;
   and forming a plasma from the etch gas; and
   flashing a passivation layer created during the etching of the phase change layer, wherein the flashing removes the passivation layer.

2. The method, as recited in claim 1, wherein the etching the phase change layer further comprises maintaining a wafer temperature below 40° C.

3. The method, as recited in claim 2, wherein the etch gas further comprises at least one of a fluorine containing compound and a chlorine containing compound.

4. The method, as recited in claim 3, wherein the etch gas further comprises a noble gas.

5. The method, as recited in claim 4, wherein the etch gas has a flow rate of noble gas, which is greater than a flow rate of the bromine containing gas.

6. The method, as recited in claim 3, wherein a flow of the at least one of a fluorine containing compound and a chlorine containing compound is less than a flow of the HBr.

7. The method, as recited in claim 1, wherein the etch gas further comprises a noble gas, and the noble gas has a flow rate which is greater than a flow rate of HBr.

8. The method, as recited in claim 7, wherein a flow of the at least one of a fluorine containing compound and a chlorine containing compound is less than the flow of the HBr.

9. A method of forming devices, comprising:
   providing a phase change layer comprising one of an alloy of germanium, antimony, and tellurium and an alloy of antimony and tellurium;
   providing an electrode layer over the phase change layer;
   opening the electrode layer, comprising the steps of:
     providing an etch gas comprising: HBr, at least one of a fluorine containing compound and a chlorine containing compound and a noble gas;
     forming a plasma from the etch gas; and
     maintaining a wafer temperature below 40° C.;
   etching the phase change layer, comprising the steps of:
     providing an etch gas comprising: HBr, at least one of a fluorine containing compound and a chlorine containing compound and a noble gas;
     forming a plasma from the etch gas; and
     maintaining a wafer temperature below 40° C.;
   flashing a passivation layer created during the etching the phase change layer, wherein the flashing removes the passivation layer;
   wherein a flow rate of the noble gas is greater than a flow rate of the HBr; and
   wherein a flow rate of the at least one of a fluorine containing compound and a chlorine containing compound is less than the flow rate of the HBr.

10. An apparatus for forming features in a phase change layer disposed, comprising:
    a plasma processing chamber, comprising:
      a chamber wall forming a plasma processing chamber enclosure;
      a substrate support for supporting a substrate within the plasma processing chamber enclosure;
      a pressure regulator for regulating the pressure in the plasma processing chamber enclosure;
      at least one electrode for providing power to the plasma processing chamber enclosure for sustaining a plasma;
      a gas inlet for providing gas into the plasma processing chamber enclosure; and
      a gas outlet for exhausting gas from the plasma processing chamber enclosure;
    a gas source in fluid connection with the gas inlet, comprising:
      a bromine containing compound gas source;
      a noble gas source; and
      an at least one of a fluorine containing compound and chlorine containing compound gas source; and a controller controllably connected to the gas source and the at least one electrode, comprising:
- at least one processor; and
- computer readable media, comprising:
  - computer readable code for providing an etch gas comprising a bromine containing compound;
  - computer readable code for forming a plasma from the etch gas; and
  - computer readable code for flashing a passivation layer created during the forming a plasma from the etch gas, wherein the flashing removes the passivation layer.

11. The apparatus, as recited in claim 10, further comprising computer readable code for providing a wafer temperature below 40° C. during the forming a plasma from the etch gas.

12. The apparatus, as recited in claim 11, wherein the bromine containing compound is HBr.

13. The apparatus, as recited in claim 12, wherein the etch gas further comprises at least one of a fluorine containing compound and chlorine containing compound.

* * * * *